(12) United States Patent
Zheng et al.

(10) Patent No.: US 11,482,977 B2
(45) Date of Patent: Oct. 25, 2022

(54) AMPLIFIER CIRCUIT STRUCTURE AND METHOD FOR CONTROLLING CIRCUIT

(71) Applicant: SMARTER MICROELECTRONICS (GUANG ZHOU) CO., LTD., Guangzhou (CN)

(72) Inventors: Yaohua Zheng, Guangzhou (CN); Ping Li, Guangzhou (CN); Minjun He, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 55 days.

(21) Appl. No.: 17/120,151

(22) Filed: Dec. 12, 2020

(65) Prior Publication Data

US 2021/0408990 A1 Dec. 30, 2021

Related U.S. Application Data

(63) Continuation of application No. PCT/CN2020/113093, filed on Sep. 2, 2020.

(51) Int. Cl.
*H03F 1/14* (2006.01)
*H03F 3/72* (2006.01)
*H03F 1/26* (2006.01)
*H03F 1/02* (2006.01)

(52) U.S. Cl.
CPC .............. *H03F 3/72* (2013.01); *H03F 1/26* (2013.01); *H03F 1/0277* (2013.01); *H03F 2203/7231* (2013.01)

(58) Field of Classification Search
CPC ...... H03F 3/72; H03F 1/26; H03F 2203/7231; H03F 2200/451; H03F 3/189; H03F 2203/7239; H03F 1/0277; H03F 1/14; H03G 1/0088
USPC ......................................... 330/9, 51; 327/124
See application file for complete search history.

(56) References Cited

U.S. PATENT DOCUMENTS

| | | | | |
|---|---|---|---|---|
| 5,909,643 | A * | 6/1999 | Aihara | H03G 1/0088 330/51 |
| 6,265,935 | B1 * | 7/2001 | Kaneda | H03G 1/0088 330/297 |
| 8,149,050 | B2 * | 4/2012 | Cabanillas | H03F 3/72 330/51 |
| 10,320,350 | B1 * | 6/2019 | Leitner | H03F 3/72 |
| 2003/0058041 | A1 * | 3/2003 | Koizumi | H03F 3/189 330/51 |

(Continued)

*Primary Examiner* — Khanh V Nguyen
(74) *Attorney, Agent, or Firm* — Syncoda LLC; Feng Ma

(57) ABSTRACT

An amplifier circuit structure can include an amplifier located in a main path, and a first switch located in a bypass. One end of a second switch is a signal output end of the amplifier circuit structure, and the other end of the second switch is configured to selectively connect to a signal output end of the bypass or a signal output end of the main path. The first and second switches are configured to control their respective operating states when a first instruction is received, such that the main path is connected to the signal input end and the signal output end of the amplifier circuit structure; and to control their respective operating states when a second instruction is received, such that the bypass is connected to the signal input end of the amplifier circuit structure and the signal output end of the amplifier circuit structure.

18 Claims, 3 Drawing Sheets

(56) References Cited

U.S. PATENT DOCUMENTS

2004/0212437 A1* 10/2004 Kim ................... H03F 3/191
   330/295
2016/0142020 A1* 5/2016 Wang ................ H03F 1/0227
   330/295

* cited by examiner controlling, by the first switch and the second switch, their respective operating states when a first instruction is received, so that the main path is connected to the signal input end of the amplifier circuit structure and the signal output end of the amplifier circuit structure; and controlling, by the first switch and the second switch, their respective operating states when a second instruction is received, so that the bypass is connected to the signal input end of the amplifier circuit structure and the signal output end of the amplifier circuit structure — 601

FIG. 6

AMPLIFIER CIRCUIT STRUCTURE AND METHOD FOR CONTROLLING CIRCUIT

CROSS-REFERENCE TO RELATED APPLICATIONS

This application is a continuation of International Application No. PCT/CN2020/113093 filed on Sep. 2, 2020, which claims priority to Chinese Patent Application No. 202010600187.4 filed on Jun. 28, 2020. The disclosures of these applications are hereby incorporated by reference in their entirety.

BACKGROUND

In a wireless communication device, a receiver needs to meet a certain dynamic range. When there is a large interference signal in the signal received by the receiver, an Analog-to-Digital Converter may have an overflow phenomenon, and a useful signal cannot be demodulated accurately, and thus the gain of the entire receiving link needs to be reduced, so that an overflow threshold cannot be reached when a large signal enters the ADC, and the useful signal may be demodulated normally.

SUMMARY

The disclosure relates generally to technologies for designing a circuit structure, and more specifically to an amplifier circuit structure and a method for controlling circuit.

Various embodiments of the disclosure provide an amplifier circuit structure, including an amplifier, a first switch and a second switch; herein, the amplifier is located in a main path, an input end of the amplifier is a signal input end of the amplifier circuit structure, the first switch is located in a bypass; one end of the second switch is a signal output end of the amplifier circuit structure, and the other end of the second switch is configured to selectively connect to a signal output end of the bypass or a signal output end of the main path; and the first switch and the second switch are configured to control their respective operating states when a first instruction is received, so that the main path is connected to the signal input end of the amplifier circuit structure and the signal output end of the amplifier circuit structure; and to control their respective operating states when a second instruction is received, so that the bypass is connected to the signal input end of the amplifier circuit structure and the signal output end of the amplifier circuit structure.

In some embodiments of the disclosure, the amplifier circuit structure further includes at least one phase compensation circuit, and the at least one phase compensation circuit is configured to perform phase compensation for a phase difference caused when the main path and the bypass receive an input signal.

In some embodiments of the disclosure, the at least one phase compensation circuit is located between an output end of the amplifier and the signal output end of the main path.

In some embodiments of the disclosure, the at least one phase compensation circuit is located between the first switch and the signal output end of the bypass.

In some embodiments of the disclosure, the at least one phase compensation circuit includes a first phase compensation circuit and a second phase compensation circuit; and herein, the first phase compensation circuit is located between an output end of the amplifier and the signal output end of the main path, and the second phase compensation circuit is located between the first switch and the signal output end of the bypass.

In some embodiments of the disclosure, one of the first phase compensation circuit and the second phase compensation circuit is configured to perform phase lead compensation, and the other of the first phase compensation circuit and the second phase compensation circuit is configured to perform phase lag compensation.

In some embodiments of the disclosure, the phase shift of the at least one phase compensation circuit is determined according to a center frequency point of the input signal.

In some embodiments of the disclosure, when the number of the phase compensation circuits for the at least one phase compensation circuit is greater than 1, the at least one phase compensation circuit includes two phase compensation circuits with different phase shift change parameters, the phase shift change parameters indicate correspondences of the phase shifts and frequencies.

In some embodiments of the disclosure, the first switch is a Single Pole Single Throw (SPST) switch.

The embodiments of the disclosure further provide a method for controlling circuit, which is applied to an amplifier circuit structure including an amplifier, a first switch and a second switch; herein, the amplifier is located in a main path, an input end of the amplifier is a signal input end of the amplifier circuit structure, the first switch is located in a bypass; one end of the second switch is a signal output end of the amplifier circuit structure, and the other end of the second switch is configured to selectively connect to a signal output end of the bypass or a signal output end of the main path, the method including:

controlling, by the first switch and the second switch, their respective operating states when a first instruction is received, so that the main path is connected to the signal input end of the amplifier circuit structure and the signal output end of the amplifier circuit structure; and controlling, by the first switch and the second switch, their respective operating states when a second instruction is received, so that the bypass is connected to the signal input end of the amplifier circuit structure and the signal output end of the amplifier circuit structure.

In the amplifier circuit structure and the method for controlling circuit provided by the embodiments of the disclosure, the amplifier circuit structure includes an amplifier, a first switch and a second switch; herein, the amplifier is located in a main path, an input end of the amplifier is a signal input end of the amplifier circuit structure, the first switch is located in a bypass; one end of the second switch is a signal output end of the amplifier circuit structure, and the other end of the second switch is configured to selectively connect to a signal output end of the bypass or a signal output end of the main path; and the first switch and the second switch are configured to control their respective operating states when a first instruction is received, so that the main path is connected to the signal input end of the amplifier circuit structure and the signal output end of the amplifier circuit structure; and to control their respective operating states when a second instruction is received, so that the bypass is connected to the signal input end of the amplifier circuit structure and the signal output end of the amplifier circuit structure.

In this way, the embodiments of the disclosure may provide high signal isolation between the main path and the bypass by adding the first switch to the bypass; when the input signal passes through the main path for signal amplification, the input signal does not pass through the first switch of the bypass, and the turn-on resistance (Ron) when the first switch is switched off is reduced, so that the insertion damage of the amplifier circuit structure is relatively low; when the input signal passes through the bypass to output, the first switch is turned on, the bypass is in a direct passing state, and the amplifier on the main path stops operating, which may provide high isolation from the main path. Generally speaking, it is beneficial to reduce the insertion damage of the input end of the amplifier of the main path, and is beneficial to reduce the noise factor of the cascaded link including the amplifier circuit structure.

BRIEF DESCRIPTION OF THE DRAWINGS

FIG. 6 is a flow diagram of a method for controlling circuit of an embodiment of the disclosure.

DETAILED DESCRIPTION

The disclosure will be further described in detail with reference to the embodiments and the drawings. It should be understood that the specific embodiments described herein are only used to explain the disclosure, rather than limiting the disclosure.

In order to allow the receiver of the wireless communication device to achieve a larger dynamic range, a bypass amplifier may usually be used based on the main path of the signal receiving circuit, so that the gain of the signal receiving circuit is reduced; the method for using the bypass amplifier needs to add a Single Pole Double Throw (SPDT) switch to switch between the main path and the bypass; however, the addition of the SPDT switch will introduce insertion loss and increase the noise factor of the signal receiving circuit.

Figure 1:
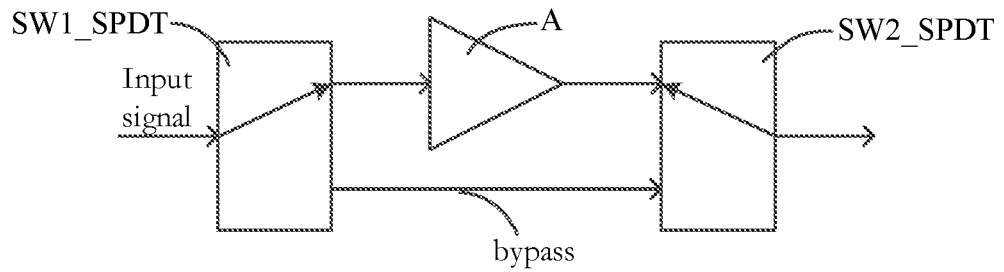
FIG. 1 is a schematic structural diagram of a signal receiving circuit in some embodiments.

FIG. 1 is a schematic structural diagram of a signal receiving circuit in some embodiments. As shown in FIG. 1, a bypass amplifier may be used to reduce the gain of the signal receiving circuit. Specifically, one end of a first Single Pole Double Throw (SPDT) switch SW1_SPDT is connected to an input signal, and the other end of the SW1_SPDT is selectively connected to an input end of a signal amplification device A or an input end of the bypass, the bypass where the amplifier is located is a main path, and the bypass is a direct connecting line of circuit; one end of a second Single Pole Double Throw (SPDT) switch SW2_SPDT is selectively connected to an output end of the signal amplifying device A or an output end of the bypass, and the other end of the SW2_SPDT is an output end of the signal receiving circuit; and here, the signal amplification device may be a Low Noise Amplifier (LNA) or other types of amplifiers.

It can be seen that the selection of the main path or the bypass may be achieved by controlling the SW1_SPDT and the SW2_SPDT. Specifically, when the amplitude of the input signal is small, the main path is turned on by controlling the SW1_SPDT and the SW2_SPDT, and the input signal may be processed by the signal amplification device A and then output; when the input signal is large, the bypass is turned on by controlling the SW1_SPDT and the SW2_SPDT, and the input signal is output through the bypass, thus when there is an interference signal with large amplitude in the input signal, the signal is output through the bypass, reducing the gain of the input signal, so that an overflow phenomenon does not occur when the ADC processes signals later, and thus the signal may be demodulated normally.

Referring to FIG. 1, the above method for using the bypass amplifier needs to add a SPDT switch to switch between the main path and the bypass; however, the addition of the SPDT switch will introduce insertion loss, and when the signal receiving circuit is used as a part of a cascaded circuit, from the perspective of the noise factor of the cascaded circuit, the increased insertion loss at the input end of the signal amplification device will significantly increase the noise factor of the cascaded circuit.

In addition, when switching between the main path and the bypass, because the signal amplification device does not operate, the input signal is output after passing only two switches. This will introduce a very large phase difference, which cannot meet communication systems with high delay requirements (low latency).

In view of the aforementioned technical problems, the embodiments of the disclosure propose an amplifier circuit structure.

Figure 2:
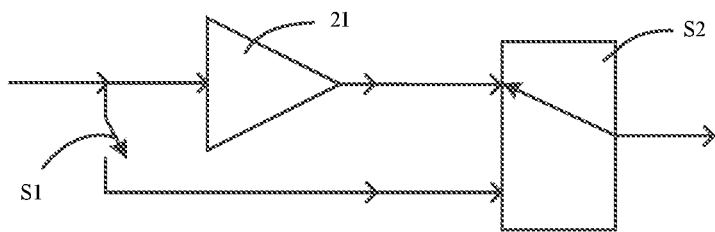
FIG. 2 is a schematic diagram of an amplifier circuit structure of an embodiment of the disclosure.

FIG. 2 is a schematic diagram of an amplifier circuit structure of an embodiment of the disclosure. As shown in FIG. 2, the amplifier circuit structure may include an amplifier 21, a first switch S1 and a second switch S2; herein, the amplifier 21 is located in a main path, an input end of the amplifier 21 is a signal input end of the amplifier circuit structure, the first switch S1 is located in a bypass; one end of the second switch S2 is a signal output end of the amplifier circuit structure, and the other end of the second switch S2 is configured to selectively connect to a signal output end of the bypass or a signal output end of the main path.

In the embodiments of the disclosure, the amplifier 21 is configured to amplify a signal, the amplifier 21 may be a low-noise amplifier or other types of amplifiers; here, parameters such as the gain of the amplifier are not limited.

Exemplarily, both ends of the first switch S1 are on the bypass, the first switch S1 may be a Single Pole Single Throw (SPST) switch, and the second switch S2 may be a SPDT switch.

In the embodiments of the disclosure, the first switch S1 and the second switch S2 are configured to control their respective operating states when a first instruction is received, so that the main path is connected to the signal input end of the amplifier circuit structure and the signal output end of the amplifier circuit structure; and to control their respective operating states when a second instruction is received, so that the bypass is connected to the signal input end of the amplifier circuit structure and the signal output end of the amplifier circuit structure.

Here, the first instruction indicates an instruction for selecting the main path, and the second instruction indicates an instruction for selecting the bypass. In practical applications, both the first switch S1 and the second switch S2 may control their respective operating states according to the received external instructions. In practical applications, the instructions may be sent to at least one of the first switch S1 or the second switch S2 by devices such as a processor.

Specifically, the first switch S1 is configured to switch off a first connection when the first instruction is received; and to switch on the first connection when the second instruction is received; the first connection indicates that the input end of the amplifier 21 is connected to the signal input end of the bypass.

The second switch S2 is configured to switch on a second connection when the first instruction is received; and to switch on a third connection when the second instruction is received; the second connection indicates that the signal output end of the main path is connected to the signal output end of the amplifier circuit structure, and the third connection indicates that the signal output end of the bypass is connected to the signal output end of the amplifier circuit structure.

It can be seen that the embodiments of the disclosure may provide high signal isolation between the main path and the bypass by adding the first switch to the bypass; when the input signal passes through the main path for signal amplification, the input signal does not pass through the first switch of the bypass, and the turn-on resistance (Ron) when the first switch is switched off is reduced, so that the insertion damage of the amplifier circuit structure is relatively low; when the input signal passes through the bypass to output, the first switch is turned on, the bypass is in a direct passing state, and the amplifier on the main path stops operating, which may provide high isolation from the main path. Generally speaking, it is beneficial to reduce the insertion damage of the input end of the amplifier of the main path, and is beneficial to reduce the noise factor of the cascaded link including the amplifier circuit structure.

Moreover, the amplifier circuit structure of the embodiments of the disclosure only needs to provide a switch on the bypass, which has the characteristics of a simple circuit structure and easy integration, and does not increase additional power consumption.

In an embodiment, the amplifier circuit structure further includes at least one phase compensation circuit, and the at least one phase compensation circuit is configured to perform phase compensation for a phase difference caused when the main path and the bypass receive an input signal.

In the embodiments of the disclosure, the phase compensation circuit may be a phase shifter, a passive phase shift network or other types of phase compensation circuits; the phase compensation circuit may perform phase lead compensation or phase lag compensation, which may be determined according to actual application requirements; in practical applications, the phase difference caused when the main path and the bypass receive the input signal may be measured in advance, and then it is determined according to the phase difference whether the phase compensation circuit needs to perform phase lead compensation or phase lag compensation, and the phase shift of the phase compensation circuit may be determined according to the phase difference, the phase shift represents the magnitude of phase compensation.

Exemplarily, the phase shift of the phase compensation circuit may be a parameter related to the signal frequency, that is, the phase shift of the phase compensation circuit is a parameter with frequency response, and the phase shifts corresponding to different signal frequencies are different, for example, when the signal frequency changes from 4 GHz to 5 GHz, the phase shift of the phase compensation circuit may change from 45° to 50°.

In some embodiments of the disclosure, the operating parameter of the at least one phase compensation circuit is determined according to the center frequency point of the input signal. In some embodiments of the disclosure, the aforementioned operating parameter includes the phase shift.

It can be seen that by setting the phase compensation circuit, it is beneficial to perform phase compensation to the phase difference caused by switching between the main path and the bypass, which may meet communication systems with high delay requirements.

In a first example, the at least one phase compensation circuit is located between an output end of the amplifier and the signal output end of the main path. In a second example, the at least one phase compensation circuit is located between the first switch and the signal output end of the bypass.

Figure 3:
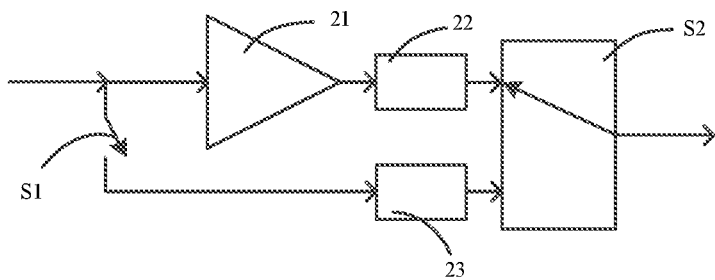
FIG. 3 is a schematic diagram of another amplifier circuit structure of an embodiment of the disclosure.

In a third example, referring to FIG. 3, the at least one phase compensation circuit includes a first phase compensation circuit 22 and a second phase compensation circuit 23; herein, the first phase compensation circuit 22 is located between an output end of the amplifier 21 and the signal output end of the main path, and the second phase compensation circuit 23 is located between the first switch S1 and the signal output end of the bypass; and the second switch S2 is configured to selectively connect to the first phase compensation circuit 22 or the second phase compensation circuit 23.

Exemplarily, one of the first phase compensation circuit 22 and the second phase compensation circuit 23 is configured to perform phase lead compensation, and the other of the first phase compensation circuit 22 and the second phase compensation circuit 23 is configured to perform phase lag compensation.

When the phase shift of the phase compensation circuit is a parameter with frequency response, and the phase shifts corresponding to different signal frequencies are different, thus it is difficult to accurately achieve phase compensation by using only one phase compensation circuit. However, no matter for the phase compensation circuit for phase lead compensation or the phase compensation circuit for phase lag compensation, the phase shift changes monotonously with frequency. With such characteristic, the embodiments of the disclosure may add phase compensation circuits to the main path and the bypass at the same time.

In an example, the phase compensation circuit for phase lead compensation may be added to the main path, meanwhile the phase compensation circuit for phase lag compensation may be added to the bypass; in a specific example, when the main path is turned on, the phase angle of P1 is lead compensated by the phase compensation circuit added to the main path, and when the bypass is turned on, the phase angle of P2 is lag compensated by the phase compensation circuit added to the bypass, herein both P1 and P2 change monotonously with the signal frequency. In this way, the phase difference caused by switching between the main path and the bypass within a wide frequency band may be compensated, and the compensated phase angle is P1+P2.

In another example, the phase compensation circuit for phase lag compensation may be added to the main path, meanwhile the phase compensation circuit for phase lead compensation may be added to the bypass; in a specific example, when the main path is turned on, the phase angle of P3 is lag compensated by the phase compensation circuit added to the main path, and when the bypass is turned on, the phase angle of P4 is lead compensated by the phase compensation circuit added to the bypass, herein both P3 and P4 change monotonously with the signal frequency. In this way, the phase difference caused by switching between the main path and the bypass within a wide frequency band may be compensated, and the compensated phase angle is P3+P4.

Figure 4:
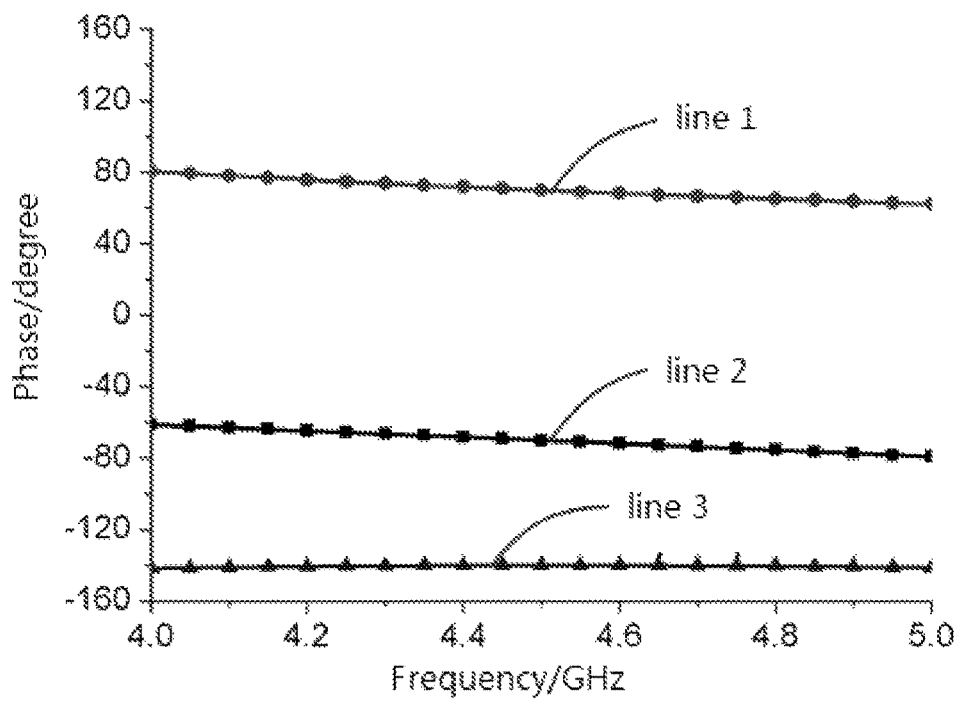
FIG. 4 is a schematic diagram of phase compensation of a specific embodiment of the disclosure.

FIG. 4 is a schematic diagram of phase compensation of a specific embodiment of the disclosure, as shown in FIG. 4, the horizontal axis represents frequency in GHz, and the vertical axis represents phase in degrees. Line 1 represents the change curve of the compensated phase of the phase compensation circuit of the main path with the signal frequency, line 2 represents the change curve of the compensated phase of the phase compensation circuit of the bypass with the signal frequency, and line 3 represents the change curve of the compensated phase of the amplifier circuit structure with the signal frequency when switching between the main path and the bypass; when the operating frequency band of the amplifier circuit structure is from 4 GHz to 5 GHz, the phase difference introduced in the band when switching between the main path and the bypass is 140°; with the amplifier circuit structure of the embodiments of the disclosure, a passive phase shift network with a center frequency point of 4.5 GHz and a phase shift of leading 70° (corresponding to line 1 in FIG. 4) may be first introduced at the output end of the main path, and a passive phase shift network with a center frequency point of 4.5 GHz and a phase shift of lagging 70° (corresponding to line 2 in FIG. 4) may be introduced at the bypass, so that for the overall amplifier circuit structure, a phase difference of 140° is introduced by 4 GHz-5 GHz in the band, that is, when switching between the main path and the bypass, the amplifier circuit structure may compensate for the phase difference of 140° introduced by 4 GHz to 5 GHz in the band.

In some embodiments of the disclosure, when the number of the phase compensation circuits for the at least one phase compensation circuit is greater than 1, the at least one phase compensation circuit includes two phase compensation circuits with different phase shift change parameters, the phase shift change parameters indicate correspondences of the phase shifts and frequencies.

In the actual circuit structure, when the amplifier operates in a wide frequency band, the phase difference introduced in the wide frequency band may not be fixed. The embodiments of the disclosure may also deal with the problem of phase difference in the wide frequency band. When the main path is turned on, the phase compensation circuit of the main path may be used first to lead or lag the phase angle of Φ+/−ΔΦ at the center frequency point in the operating frequency band, and when the bypass is turned on, the phase compensation circuit of the bypass may be used to lead or lag the phase angle of Φ+/−ΔΦ at the center frequency point in the operating frequency band, because the two change monotonously with frequency, and the phase shift change parameters of the phase compensation circuits of the main path and the bypass are different, for example, for the phase compensation circuits of the main path and the bypass, slopes of the phase shifts changing with frequency are different, the phase difference caused by switching between the main path and the bypass may be compensated in the wide frequency band, and differences of the phases in the wide band may be compensated at the same time.

Figure 5:
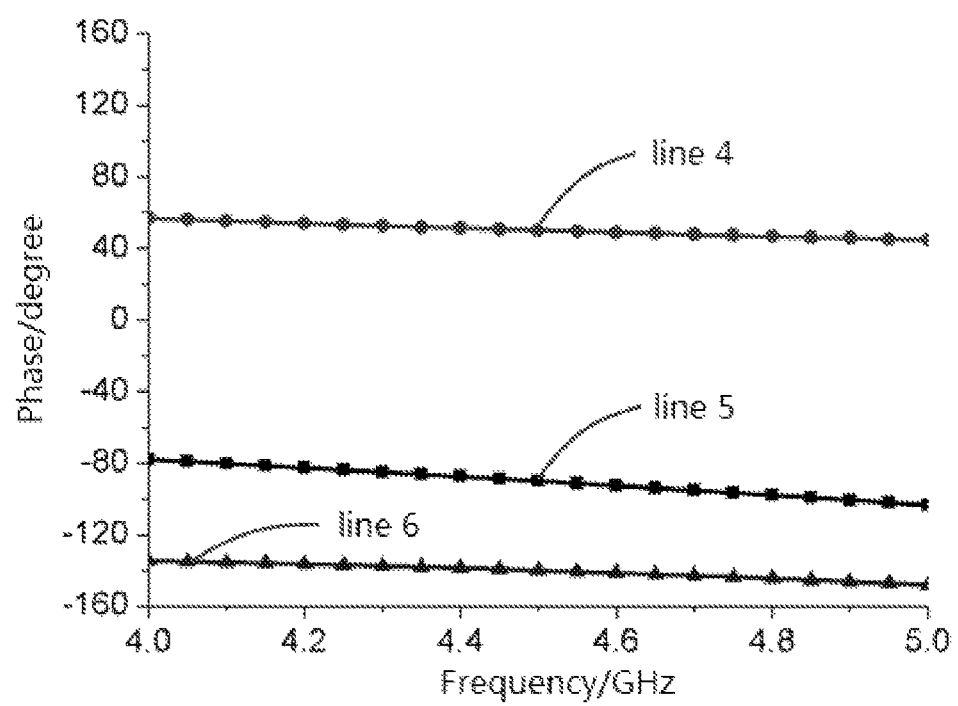
FIG. 5 is a schematic diagram of phase compensation of another specific embodiment of the disclosure.

In a specific example, referring to FIG. 5 which is a schematic diagram of phase compensation of another specific embodiment of the disclosure, as shown in FIG. 5, the horizontal axis represents frequency in GHz, and the vertical axis represents phase in degrees. Line 4 represents the change curve of the compensated phase of the phase compensation circuit of the main path with the signal frequency, line 5 represents the change curve of the compensated phase of the phase compensation circuit of the bypass with the signal frequency, and line 6 represents the change curve of the compensated phase of the amplifier circuit structure with the signal frequency when switching between the main path and the bypass; when the operating frequency band of the amplifier circuit structure is from 4 GHz to 5 GHz, the phase difference introduced in the band when switching between the main path and the bypass is 135° to 150°; with the amplifier circuit structure of the embodiments of the disclosure, a passive phase shift network with a center frequency point of 4.5 GHz and a phase shift of leading 50° (corresponding to line 4 in FIG. 5) may be first introduced at the output end of the main path, and a passive phase shift network with a center frequency point of 4.5 GHz and a phase shift of lagging 90° (corresponding to line 5 in FIG. 5) may be introduced at the bypass, and because the phase shifts of the two passive phase shift networks are different, for the overall amplifier circuit structure, a phase difference of 135° to 150° is introduced by 4 GHz-5 GHz in the band, that is, when switching between the main path and the bypass, the amplifier circuit structure may compensate for the phase difference of 135° to 150° introduced by 4 GHz to 5 GHz in the band.

The embodiments of the disclosure further provide a method for controlling circuit, which is applied to an amplifier circuit structure including an amplifier, a first switch and a second switch; herein, the amplifier is located in a main path, an input end of the amplifier is a signal input end of the amplifier circuit structure, the first switch is located in a bypass; one end of the second switch is a signal output end of the amplifier circuit structure, and the other end of the second switch is configured to selectively connect to a signal output end of the bypass or a signal output end of the main path.

FIG. 6 is a flow diagram of a method for controlling circuit of an embodiment of the disclosure, as shown in FIG. 6, the flow includes:

In S601, controlling, by the first switch and the second switch, their respective operating states when a first instruction is received, so that the main path is connected to the signal input end of the amplifier circuit structure and the signal output end of the amplifier circuit structure; and controlling, by the first switch and the second switch, their respective operating states when a second instruction is received, so that the bypass is connected to the signal input end of the amplifier circuit structure and the signal output end of the amplifier circuit structure.

In some embodiments of the disclosure, the amplifier circuit structure further includes at least one phase compensation circuit, and the at least one phase compensation circuit is configured to perform phase compensation for a phase difference caused when the main path and the bypass receive an input signal.

In some embodiments of the disclosure, the at least one phase compensation circuit is located between an output end of the amplifier and the signal output end of the main path.

In some embodiments of the disclosure, the at least one phase compensation circuit is located between the first switch and the signal output end of the bypass.

In some embodiments of the disclosure, the at least one phase compensation circuit includes a first phase compensation circuit and a second phase compensation circuit; and herein, the first phase compensation circuit is located between an output end of the amplifier and the signal output end of the main path, and the second phase compensation circuit is located between the first switch and the signal output end of the bypass.

In some embodiments of the disclosure, one of the first phase compensation circuit and the second phase compensation circuit is configured to perform phase lead compensation, and the other of the first phase compensation circuit and the second phase compensation circuit is configured to perform phase lag compensation.

In some embodiments of the disclosure, the phase shift of the at least one phase compensation circuit is determined according to a center frequency point of the input signal.

In some embodiments of the disclosure, when the number of the phase compensation circuits for the at least one phase compensation circuit is greater than 1, the at least one phase compensation circuit includes two phase compensation circuits with different phase shift change parameters, the phase shift change parameters indicate correspondences of the phase shifts and frequencies.

In some embodiments of the disclosure, the first switch is a Single Pole Single Throw (SPST) switch.

The above descriptions are merely specific implementations of the disclosure, however, the protection scope of the disclosure is not limited to thereto, and any technicians who are familiar with the technical filed may readily conceive of variations or substitutions within the scope of the technology disclosed by the disclosure, and the variations or substitutions shall be covered by the protection scope of the disclosure. Therefore, the protection scope of the disclosure shall be based on the protection scope of the claims.

The terms "first" and "second" are used for descriptive purposes only and are not to be construed as indicating or implying a relative importance or implicitly indicating the number of technical features indicated. Thus, elements referred to as "first" and "second" may include one or more of the features either explicitly or implicitly. In the description of the present disclosure, "a plurality" indicates two or more unless specifically defined otherwise.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features may be described above as acting in certain combinations and even initially claimed as such, one or more features from a claimed combination can in some cases be excised from the combination, and the claimed combination may be directed to a subcombination or variation of a subcombination.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. An amplifier circuit structure, comprising an amplifier, a first switch and a second switch; wherein
the amplifier is located in a main path, an input end of the amplifier is a signal input end of the amplifier circuit structure, the first switch is located in a bypass; one end of the second switch is a signal output end of the amplifier circuit structure, and the other end of the second switch is configured to selectively connect to a signal output end of the bypass or a signal output end of the main path;
the first switch and the second switch are configured to control their respective operating states when a first instruction is received, so that the main path is connected to the signal input end of the amplifier circuit structure and the signal output end of the amplifier circuit structure; and to control their respective operating states when a second instruction is received, so that the bypass is connected to the signal input end of the amplifier circuit structure and the signal output end of the amplifier circuit structure;
the amplifier circuit structure further comprises at least one phase compensation circuit; and
the at least one phase compensation circuit is configured to perform phase compensation for a phase difference caused when the main path and the bypass receive an input signal.

2. The amplifier circuit structure of claim 1, wherein the at least one phase compensation circuit is located between an output end of the amplifier and the signal output end of the main path.

3. The amplifier circuit structure of claim 1, wherein the at least one phase compensation circuit is located between the first switch and the signal output end of the bypass.

4. The amplifier circuit structure of claim 1, wherein the at least one phase compensation circuit comprises a first phase compensation circuit and a second phase compensation circuit; and
wherein the first phase compensation circuit is located between an output end of the amplifier and the signal output end of the main path, and the second phase compensation circuit is located between the first switch and the signal output end of the bypass.

5. The amplifier circuit structure of claim 4, wherein one of the first phase compensation circuit and the second phase compensation circuit is configured to perform phase lead compensation, and the other of the first phase compensation circuit and the second phase compensation circuit is configured to perform phase lag compensation.

6. The amplifier circuit structure of claim 5, wherein the phase shift of the at least one phase compensation circuit is determined according to a center frequency point of the input signal.

7. The amplifier circuit structure of claim 6, wherein when the number of the phase compensation circuits for the at least one phase compensation circuit is greater than 1, the at least one phase compensation circuit comprises two phase compensation circuits with different phase shift change parameters, the phase shift change parameters indicate correspondences of the phase shifts and frequencies.

8. The amplifier circuit structure of claim 1, wherein the first switch is a Single Pole Single Throw (SPST) switch.

9. A wireless communication device comprising the amplifier circuit structure of claim 1, wherein
the first switch is configured to provide high signal isolation between the main path and the bypass;
in a case that an input signal passes through the main path for signal amplification, the input signal does not pass through the first switch of the bypass to thereby reduce insertion damage of the amplifier circuit structure; and
in a case that the input signal passes through the bypass to output, the first switch is turned on, the bypass is in a direct passing state, and the amplifier on the main path stops operating, thereby providing high isolation from the main path, reducing the insertion damage of an input end of the amplifier of the main path.

10. A method for controlling circuit, which is applied to an amplifier circuit structure comprising an amplifier, a first switch and a second switch; wherein
the amplifier is located in a main path, an input end of the amplifier is a signal input end of the amplifier circuit structure, the first switch is located in a bypass; and
one end of the second switch is a signal output end of the amplifier circuit structure, and the other end of the second switch is configured to selectively connect to a signal output end of the bypass or a signal output end of the main path,
the method comprising:
controlling, by the first switch and the second switch, their respective operating states when a first instruction is received, so that the main path is connected to the signal input end of the amplifier circuit structure and the signal output end of the amplifier circuit structure; and
controlling, by the first switch and the second switch, their respective operating states when a second instruction is received, so that the bypass is connected to the signal input end of the amplifier circuit structure and the signal output end of the amplifier circuit structure;
wherein
the amplifier circuit structure further comprises at least one phase compensation circuit; and
the method further comprises performing phase compensation, with the at least one phase compensation circuit, for a phase difference caused when the main path and the bypass receive an input signal.

11. The method of claim 10, wherein the at least one phase compensation circuit is located between an output end of the amplifier and the signal output end of the main path.

12. The method of claim 10, wherein the at least one phase compensation circuit is located between the first switch and the signal output end of the bypass.

13. The method of claim 10, wherein the at least one phase compensation circuit comprises a first phase compensation circuit and a second phase compensation circuit; and
wherein the first phase compensation circuit is located between an output end of the amplifier and the signal output end of the main path, and the second phase compensation circuit is located between the first switch and the signal output end of the bypass.

14. The method of claim 13, wherein one of the first phase compensation circuit and the second phase compensation circuit is configured to perform phase lead compensation, and the other of the first phase compensation circuit and the second phase compensation circuit is configured to perform phase lag compensation.

15. The method of claim 14, wherein the phase shift of the at least one phase compensation circuit is determined according to a center frequency point of the input signal.

16. The method of claim 15, wherein when the number of the phase compensation circuits for the at least one phase compensation circuit is greater than 1, the at least one phase compensation circuit comprises two phase compensation circuits with different phase shift change parameters, the phase shift change parameters indicate correspondences of the phase shifts and frequencies.

17. The method of claim 10, wherein the first switch is a Single Pole Single Throw (SPST) switch.

18. The method of claim 10, further comprising:
in a case that an input signal passes through the main path for signal amplification, preventing the input signal from passing through the first switch of the bypass to thereby reduce insertion damage of the amplifier circuit structure; and
in a case that the input signal passes through the bypass to output, turning on the first switch, such that the bypass is in a direct passing state, and the amplifier on the main path stops operating, thereby providing high isolation from the main path, reducing the insertion damage of an input end of the amplifier of the main path.

* * * * *